United States Patent [19]

Idei et al.

[11] Patent Number: 5,821,818
[45] Date of Patent: Oct. 13, 1998

[54] PHASE LOCKED LOOP CIRUIT FOR A LIQUID CRYSTAL DISPLAY

[75] Inventors: Seiichi Idei, Sagamihara; Takuya Ishikawa, Hino, both of Japan

[73] Assignee: International Business Machines Corporation, Armonk, N.Y.

[21] Appl. No.: 753,545

[22] Filed: Nov. 26, 1996

[30] Foreign Application Priority Data

Nov. 29, 1995 [JP] Japan .................................. 7-310241

[51] Int. Cl.$^6$ .............................. H03L 7/099; H03L 7/10; H03L 7/18
[52] U.S. Cl. ............................ 331/17; 331/16; 331/36 C; 331/177 V; 331/DIG. 2; 327/156; 327/105
[58] Field of Search .................................. 331/4, 11, 16, 331/17, 25, 36 C, 117 R, 117 FE, 177 V, DIG. 2; 327/156–159, 105–107

[56] References Cited

U.S. PATENT DOCUMENTS

| | | | |
|---|---|---|---|
| 4,131,862 | 12/1978 | Black et al. | 331/4 |
| 4,213,096 | 7/1980 | Daniel, Jr. | 455/260 |
| 4,513,448 | 4/1985 | Maher | 455/265 |
| 5,036,295 | 7/1991 | Kamitani | 331/36 C X |
| 5,124,671 | 6/1992 | Srivastava | 331/10 |
| 5,254,958 | 10/1993 | Flach et al. | 331/DIG. 2 X |
| 5,408,196 | 4/1995 | Sempel et al. | 329/325 |

Primary Examiner—David Mis
Attorney, Agent, or Firm—James E. Murray

[57] ABSTRACT

This single voltage controlled oscillator for a PLL circuit has two control loops: a low noise ration is maintained by a main loop; while a wide frequency capture range is ensured by a sub-loop controlled by a one-chip microcomputer. The main control loop is a low gain loop with a narrow capture range that compares the phase of the output of the PLL circuit with the phase of a horizontal synchronous video signal supplied to a LCD display. The sub-loop is a high gain loop with a broad frequency range that includes a processor that monitors the lock on the main loop. When the lock is broken, the processor increments or decrements the voltage supplied to this sub-loop in one or more steps until the lock is reestablished, and the PLL circuit is again operating within the narrow capture range of the low gain loop.

12 Claims, 6 Drawing Sheets

PHASE LOCKED LOOP CIRUIT FOR A LIQUID CRYSTAL DISPLAY

FIELD OF THE INVENTION

The present invention relates to phase locked loop (PLL) circuits, and in particular to a PLL circuit that regenerates a dot-clock supplied to a liquid crystal display device.

BACKGROUND OF THE INVENTION

Cathode-ray tube (CRT) display devices are the most commonly used monitors for personal computers (PCs). However, liquid crystal displays (LCDs) have certain advantages over CRT display devices for PC use; they require reduced space and power, and provide better screen quality. Of particular interest, are LCD monitors that can be directly driven by the common analog RGB interfaces for CRT monitors. To be plug-compatible with CRT monitors, CD monitors must be driven by the same interface used for the CRT monitor. This requires that the dot-clock signal of the system be regenerated in an interface board for the LCD monitor. PLL circuits can be used in regenerating the dot-clock. A requirement for such a PLL circuit is that the regenerated dot-clock be very stable so that there is no screen jitter and for multi-scan monitor purposes the PLL circuit must have a wide frequency range.

The relationship stability of a dot-clock has to screen jitter can be seen in FIG. 4. The dot-clock signal regenerated by the PLL circuit serves as a sampling clock that is used for converting an analog RGB signal into a digital signal. The data obtained by A/D conversion are transmitted to an LCD panel and are displayed on a screen at an intensity (gray scale level) determined by the data. FIG. 4 is a graph showing how a dot-clock is used to convert an analog video signal for a specific pel on a static screen into a digital signal. The vertical axis represents the voltage and the horizontal axis represents the time. An intersection of the vertical solid line and an analog video signal wave defines the sampling point (the leading edge or the falling edge of output signals of the dot-clock). Assume that as a result of variations in the dot-clock signal, the sampling point fluctuates within the range ΔT, indicated by the vertical broken lines. As a result of distortion of the wave of the analog video signal, the magnitude of the voltage sample varies within the range ΔV, indicated by the horizontal broken lines. Due to this variation in the voltage sample, data obtained by the analog to digital conversion results in the modulation of the intensity that is evidenced on screen as jitter. Jitter on a display screen due to instability of the regenerated clock is a fatal defect for a PC display device that primarily handles static images.

Consider the case where the length of an analog video signal for each pel is 15 ns (about 65 Mhz of a clock frequency). When the frequency change range is +/–100 ppm and the total number of clocks is 2000 (corresponding to 1 to 2 lines on a screen), ΔT is about +/–3 ns. A ΔT of 6 ns means that the sampling point can range over 40% of the 15 ns length of the input wave of an analog video signal for a pel.

The PLL circuit must provide a highly stable (+/–20 ppm or lower) regenerated clock. Two specific display modes are shown below in Table 1 to explain the requirement of a broad frequency capture range.

TABLE 1

| Display mode | Resolution | Refresh rate | Dot-clock |
|---|---|---|---|
| VGA | 640 × 480 | 60 Hz | 25 175MHz (video adaptor card A) |
| XGA | 1024 × 768 | 60 Hz | 25.250MHz (video adaptor card B) |
| | | | 65.000MHz (video adaptor card A) |
| | | | 65.125MHz (video adaptor card B) |

According to Table 1, even with the same screen resolution VGA or XGA and the same refresh rate 60 Hz, a dot-clock on the system side differs around 100 Khz, depending on which video adaptor card (card A or card B) is used. Table 1 is only one example, and in order to cope with all types of systems, a frequency capture range of approximately +/–500 Khz is required for a given screen resolution and refresh rate. That is, any voltage-controlled oscillator (VCO) that is a constituent of the PLL circuit requires a minimum frequency range of +/–500 Khz. A number of such oscillators can be connected in parallel one for each of the screen resolutions to be supported, or alternatively, a single VCO with a wide variable frequency range, covering the lowest frequency to the highest frequency, can be used.

High stability and a wide frequency capture range are performance features required for an LCD monitor PLL circuit. However, high stability and a wide frequency capture range are conflicting requirements. How they are related to each other will be explained in connection with FIG. 5 which is a graph showing the relationship between a conversion gain for the VCO and the variation in frequency range. The vertical axis represents the oscillation frequency and the horizontal axis represents the control voltage for a VCO. Δf/Δv (df/dv) is the conversion gain. As is apparent from FIG. 5, as the conversion gain is reduced, the variation frequency range for the VCO is narrowed, as, accordingly, is the frequency capture range of the PLL circuit.

A method using a low pass filter (LPF) for reducing a high frequency gain and for limiting a noise band width is employed to increase the stability of a PLL circuit relative to input noise. Use of this method is limited, however, because of the increase in the acquisition time and the danger that the lock for the PLL circuit will be released. Further, in the LCD monitor, there are many types of low frequency noises: switching noises caused by a backlight inverter; and noises caused when synchronization with a refresh rate is performed.

The noise affects not only the input to the PLL circuit but also the analog portion in the loop, i.e., the voltage control section of the VCO. As is shown in FIG. 5, frequency change width Δf of the voltage control section relative to noise Δv is in proportion to the conversion gain. Thus, required stability can not be provided unless the conversion gain for the VCO is set small. In this manner, the loop gain for the PLL circuit is reduced and the stability of the input noise is enhanced. However, as higher stability is obtained, the conversion gain of the VCO is decreased, and accordingly, the frequency capture range is narrowed.

FIG. 6 shows voltage-controlled crystal oscillators (VCXO) employed in a PLL circuit; while FIG. 7 shows a PLL circuit with VCOs using LC resonance. Both are for providing both the screen resolutions shown in Table 1. Both circuits are the same except for the different VCOs employed. In both circuits, a microcomputer 10 determines the resolution mode from the horizontal synchronous (H-Sync) signals and a vertical synchronous (V-Sync) signals that are provided by a computer system, and extracts the appropriate frequency division ration from an EEPROM 12 and uses it to set a variable frequency divider 14. At the same time, microcomputer 10 sets a selector 16 for the reception of the output from the appropriate VCO. In FIG. 6, a VGA VCXO 20 and an XGA VCX) 22 are connected in parallel to the selector 16 for selection of the appropriate output. In FIG. 7, a VGA VCO 24 and an XGA VCO 26, both utilize a LC resonance tank circuit in combination with a voltage controlled oscillator circuit. They are connected in parallel to the selector 16 for selection of the appropriate output.

The clock output of the VCO 20, 22, 24 or 26 that is selected is divided by the variable frequency divider 14, and the result is transmitted to a phase comparator 18, which compares the received signal with signal H-Sync from the system. The phase difference between those two signals is sent to charge pumps 30 and 32. The output of both the charge pumps, which is pulse width modulated signal, is transmitted to the VCO 20 to 26 via low-pass filters 34 and 36. The output of the low pass filters, which is a DC level Vc that varies in magnitude with the length of the pulses from the charge pump, is fed back to the voltage-frequency control terminal of the pertinent VCO. The PLL circuits are thus locked so their output frequency matches the dot-clock of the system.

In the PLL circuit shown in FIG. 6, the frequency variable range of the VCXO is approximately +/−0.01% because of the property of a crystal oscillator. With 25 Mhz, the frequency variable range is about +/−2.5 Khz. Accordingly, the frequency capture range for the PLL is only +/−2.5 Khz, and the VCXOs must therefore be connected in parallel for each resolution. In addition, since the obtained range is less than +/−500 Khz, the circuit of FIG. 6 supports only video adaptor card A in Table 1. So long as the VCXO is used as the voltage-controlled oscillator, multiscanning can not be performed to cover both the VGA and XGA ranges of Table 1. Further, since the VCXO is expensive, circuit manufacturing costs are high even though the VCXOs range is limited. However, VCXOs provide a highly stabilized dot-clock within +/−10 ppm of the desired frequency thus obtaining high image quality with no jitter.

In the PLL circuit shown in FIG. 7, the LC resonant VCOs 24 and 26 respectively comprise coils (L) 40 and 42, varactor diodes (C) 44 and 46, and voltage control oscillator circuits 48 and 49 such as the Motorola voltage controlled oscillator circuit MC1648 described on pages 4-3 to 4-9 in the "Motorola MECL Data " Manual® Motorola Inc 1993, which manual is incorporated herein by reference. With the appropriate L and C, the VCO can provide low conversion gain, even though its frequency variable range is as narrow as that of the VCXO in FIG. 6. However, variation in the oscillating frequency f are great; because of manufacturing variations of L and C and changes in those elements occurring with changes in temperature and the elapse of time.

A frequency variable range of +/−10% is required to ensure a lock by the PLL circuit of FIG. 7 at a specific frequency. For a 25 Mhz VCO, the frequency variable range is designed to be +/−2.5 Mhz at the minimum, and the conversion gain of the VCO is 1000 times that of the VCXO shown in FIG. 6. Thus, the stability of the VCO exceeds +/100 ppm causing jitter on the LCD screen, so that practical use of the screen as a PC display device is difficult. It should be noted that putting image quality aside: the VCO is less expensive than the VCXO and the frequency variable range is wider than that of the VCXO.

From the above discussion, it should be apparent that with the described techniques, it is difficult to acquire a PLL circuit that both regenerates a dot-clock with high stability and also possesses a wide frequency capture range.

Therefore, it is an object of the present invention to provide a PLL circuit that provides a stable regenerated dot-clock signal and can ensure a wide frequency capture range.

It is another object of the present invention to provide such a PLL circuit which is inexpensive to manufacture.

SUMMARY OF THE INVENTION

To achieve the above objects, the present invention provides a PLL circuit containing a single voltage controlled oscillator with two control loops: a low noise ratio is maintained by a main loop; while a wide frequency capture range is obtained by a sub-loop controlled by a microcomputer. The main control loop is a low gain loop with a narrow capture range that compares the phase of the output of the PLL circuit with the phase of a horizontal synchronous video signal supplied to the LCD display. The sub-loop is a high gain loop with a broad frequency range that includes a processor that monitors the lock on the main loop. When the loop is broken, the processor increments or decrements the voltage supplied to this sub-loop in one or more steps until the lock is reestablished, and the PLL circuit is again operating within the narrow capture range of the low gain loop.

DETAILED DESCRIPTION OF THE INVENTION

Figure 1:
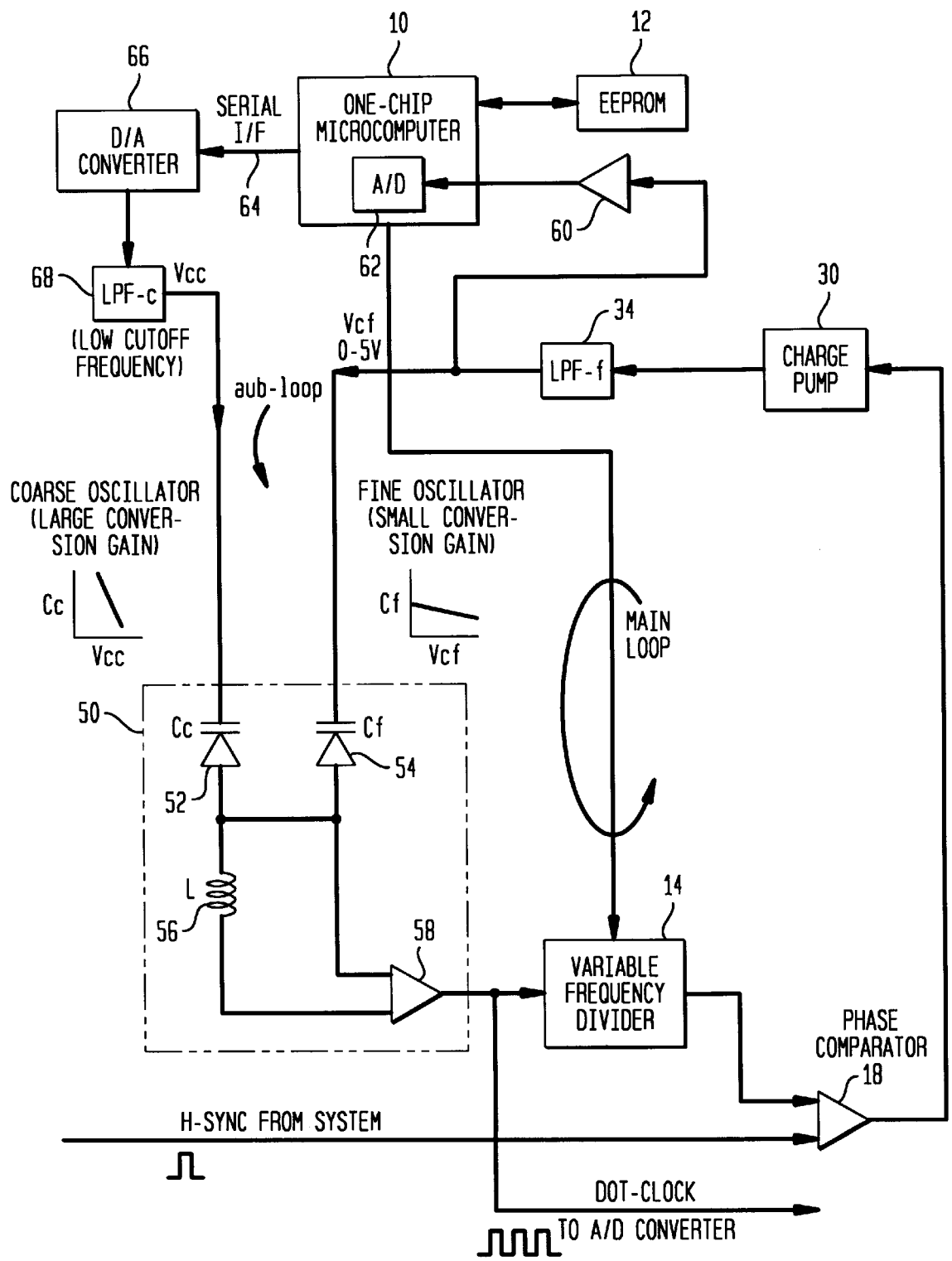
FIG. 1 is a diagram illustrating a PLL circuit according to one embodiment of the present invention.
Figure 7:
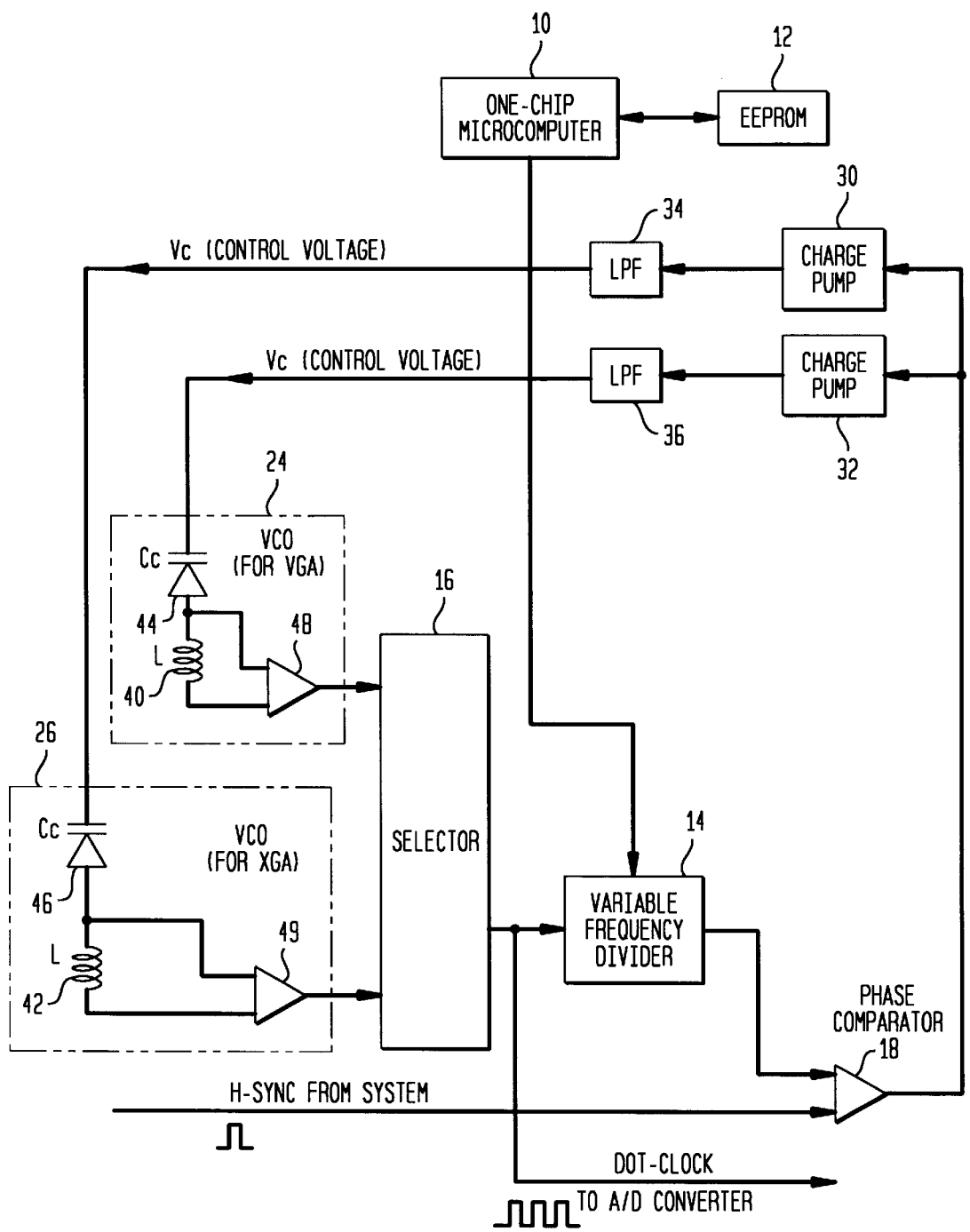
FIG. 7 is a diagram illustrating another conventional PLL circuit.

As shown in FIG. 1, the PLL circuit of the present invention, like the PLL circuit shown in FIG. 7, employs an LC resonant VCO 50. The VCO 50 has a coarse Cc 52 and a fine Cf 54 as resonance variable-capacitance diodes. The variable-capacitance diodes 52 and 54 are connected to a VCO circuit 58, like the VCO circuits 48 and 49 in FIG. 7, via a coil 56, while the variable-capacitance diode 52 is connected directly to the VCO circuit 58. Hereinafter, the coil 56 and the VCO circuit 58 are called a common circuit section, and the circuit portion including the variable-capacitance diode 54 is called a fine oscillation circuit, and the circuit portion including the variable-capacitance diode 52 is called a coarse oscillation circuit.

The output of the VCO 50 is transmitted to a variable frequency divider 14, and the output of the variable frequency divider 14 is sent to one input terminal of a phase comparator 18. An H-Sync signal from the computer system is received at the other input terminal of the phase comparator 18. The output of the phase comparator 18 is transmitted to a low-pass filter (LPF-f) 34 via a charge pump 30.

The output of the low-pass filter 34 is sent to the varactor diode Cf 54 of the VCO 50 as a control voltage Vcf for the fine oscillation circuit, and is also transmitted via a buffer 60 to an A/D converter 62 of a one-chip microcomputer 10.

An EEPROM 12 is connected to the one-chip microcomputer 10, and the one-chip microcomputer 10 selects from the EEPROM 12 a predetermined frequency division ratio, which is determined by the operating resolution, and uses it to set the variable frequency divider 14.

A D/A converter 66 is connected to the one-chip microcomputer 10 by a serial interface 64. The output of the D/A converter 66 is transmitted to the varactor diode Cc 52 of the VCO 50, through a low-pass filter (LPF-C) 68, as a control voltage Vcc for the coarse oscillation circuit.

A difference between the VCO 50 in the PLL circuit of the present invention and one of the VCOs 24 or 26 in the PLL circuit in FIG. 7, is that the coarse variable-capacitance diode Cc 52 and the fine variable-capacitance diode Cf 54 for resonance are provided in a single VCO. As a result, the oscillation frequency f of the VCO 50 is as follows.

$$f(Vcf, Vcc) = \frac{1}{2\pi} * \{L(Cc+Cf)\}^{-\frac{1}{2}} \tag{1}$$

The variable-capacitance diode Cf 54 employed in this case has a small dCf/DVcf with which the oscillation frequency f can be varied by about +/−0.01%, which is about the same range as that for the VCXO, relative to the control voltage Vcf of the fine oscillation circuit.

The variable-capacitance diode Cc52 employed has a dCc/dVcc that is about 10,000 times the Dcf/Dvcf. The frequency variable range f for the VCO as expressed in (1) is substantially controlled by the coarse oscillation circuit, and is about 10 times of that in FIG. 7, which is about 50 Mhz for the frequency variable range.

When a lock is set by the PLL, the control voltage (Vcc) of the coarse oscillation circuit is fixed and only the main loop that consists of the fine oscillation circuit, which begins with the variable frequency divider 14 and encompasses the phase comparator 18, the charge pump 30, the LPF-f 34, and the VCO 50, is fed back. Thus, conversion gain K for the VCO 50 is represented as follows:

$$K = df/Dvcf = -L/4\pi * \{L(Cc+Cf)\}^{-\frac{3}{2}} * Dcf/Dvcf \tag{2}$$

As previously mentioned, since the Dcf/Dvcf is small, a loop gain at the time of a lock is as low as that for the VCXO.

The control voltage (Vcf) of the fine oscillation circuit is transmitted via the buffer 60, such as an operational amplifier that has a high input impedance, to the A/D converter 62 in the one-chip microcomputer 10, and sampling is performed on the control voltage Vcf as digital data. As the one-chip microcomputer 10 is connected with the D/A converter 66 via the serial interface 64, the output of the one-chip microcomputer 10 is sent via the low-pass filter (LPF-c) 68 to the variable-capacitance diode Cc 52 of the coarse oscillation circuit.

Thus, the sub-loop that is formed begins with the one-chip microcomputer 10 and encompasses the D/A converter 66, the LPF-c 68, the variable-capacitance diode Cc 52, the variable frequency divider 14, the phase comparator 18, the charge pump 30, the LPF-f 34, and the buffer 60.

The cutoff frequency for the LPF-c 68 is set lower than the value of the theoretical limit when the LPF-c is operated in a normal PLL circuit, so that the coarse oscillation circuit, which has a great conversion gain, will not be affected by noise in a monitor. As will be described later, since the coarse oscillation circuit is not fed back at the time a lock is set, a lock set by the PLL is not released.

Figure 6:
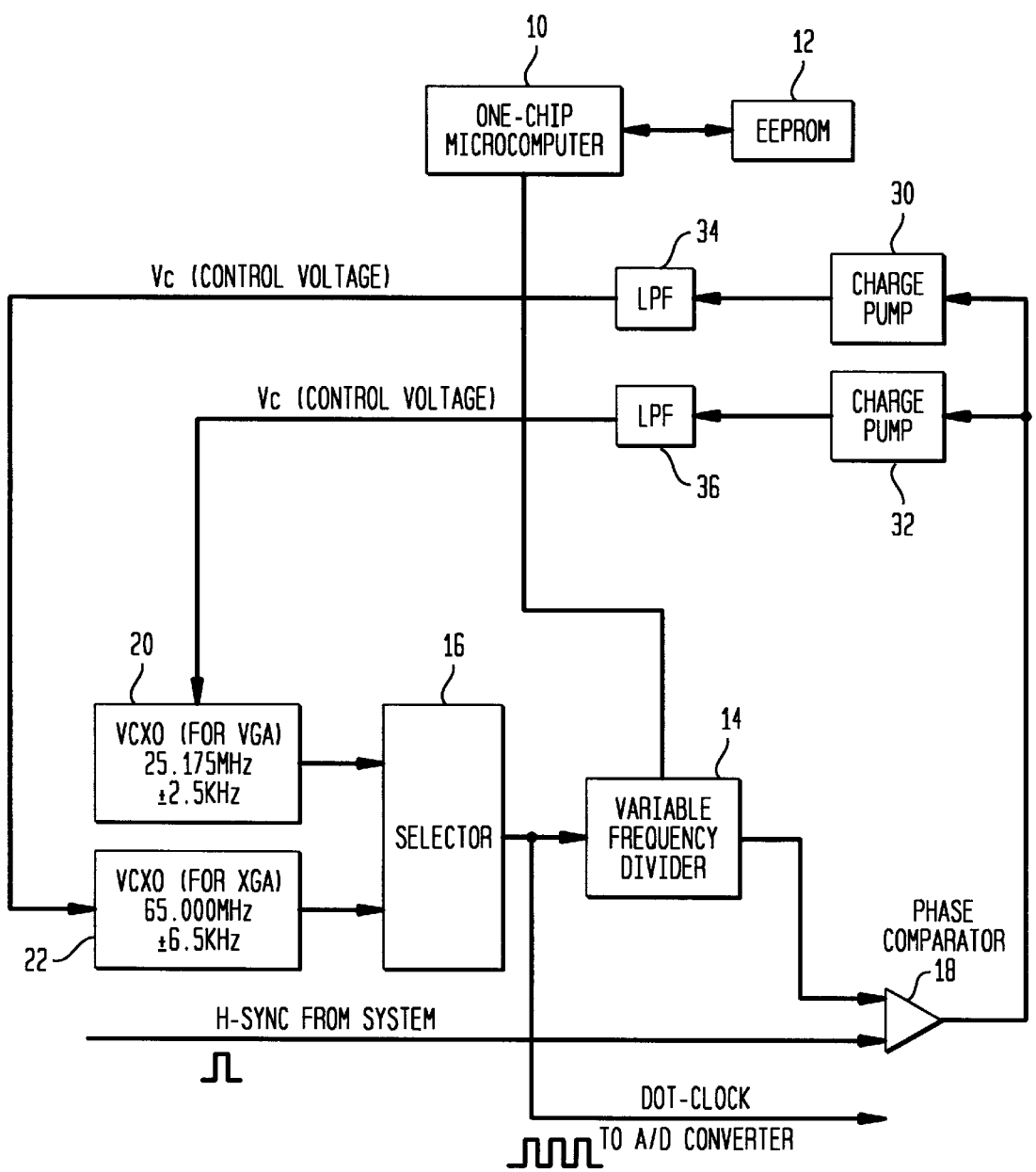
FIG. 6 is a diagram showing a conventional PLL circuit.

The operation of the PLL circuit of the present invention will now be explained, with the processing being separated into normal operation when the lock is in operation, and the shift processing when a frequency is changed and the lock is broken. When the PLL is locked at a predetermined frequency in synchronization with a dot-clock of the system, and data are displayed on an LCD monitor screen, the output of the D/A converter 66 in the sub-loop is fixed and only the main loop is fed back. As is previously described, since the loop gain for the main loop is low, the main loop is not easily affected by noise, and it can acquire a dot-clock having the high stability obtained by the VCXO shown in FIG. 6.

Figure 2:
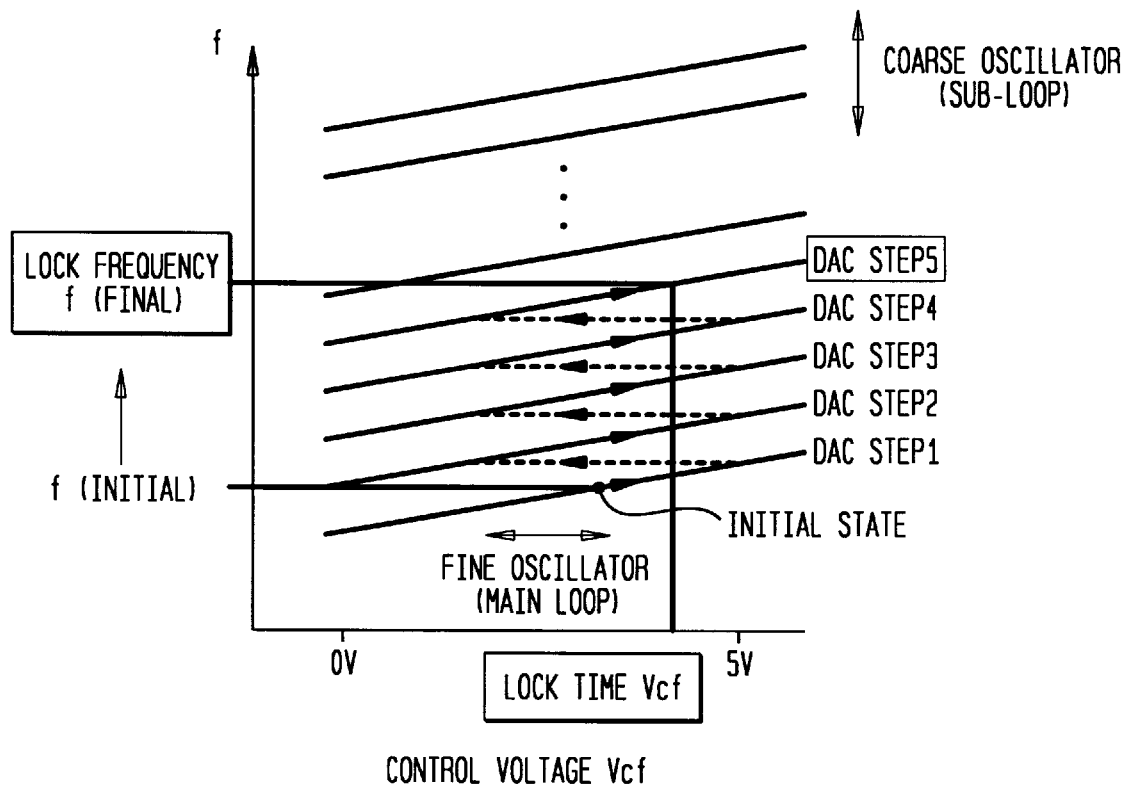
FIG. 2 is a graph showing the processing for the main loop and a sub-loop in the PLL circuit of the present invention when a frequency is changed.

FIG. 2 is a graph showing the locking when the frequency is changed. Assume that, as the initial state, the PLL circuit is locked by the main loop at frequency F (initial).

Presuming that the dynamic range of the Vcf is 0 to 5 V and the frequency is increased from f(initial) to f(final), Vcf reaches the upper limit, 5 V, and the lock set by the PLL is released. The output of the A/D converter 62 at this time reaches the maximum, while the one-chip microcomputer 10 determines that the lock has been released. The one-chip microcomputer 10 makes a change in the voltage to the D/A converter 66 which results in a small increase in the voltage Vcc to the coarse oscillator circuit. Since the conversion gain for the coarse oscillator circuit is large, the oscillation frequency is raised substantially.

Figure 8:
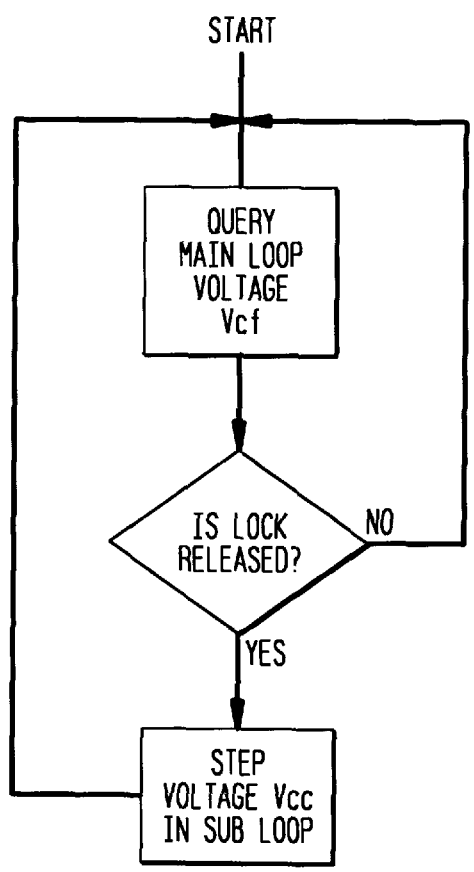
FIG. 8 is a flow diagram of processor operation.

Then, the one-chip microcomputer 10, which was in the wait state, refers to Vcf again when the acquisition time for the main loop has elapsed. If the main loop is not locked, another step increase in the output is made. By repeating the above described process, Vcf follows along the broken lines in FIG. 2, and finally, when the output of the D/A converter 66 reaches step 5, the main loop is locked. FIG. 8 shows the functioning of the microcomputer in the above process.

When the frequency decreases, the main loop can be relocked in the same manner. Besides the variance of the LC resonance VCO and the time-transient change, which are cited in the background in FIG. 7, are coped with.

Figure 3:
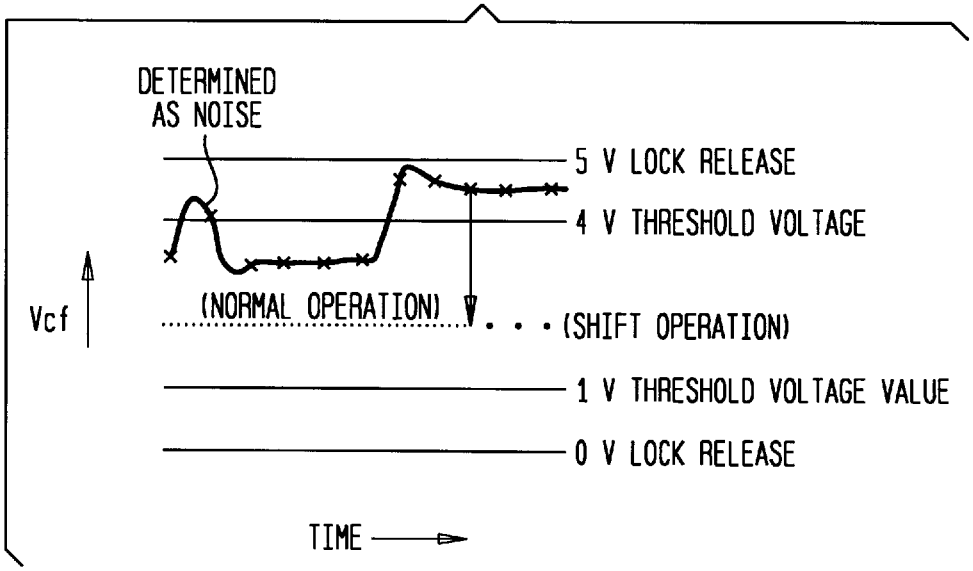
FIG. 3 is a diagram for explaining the determination process performed by a one-chip microcomputer for the shift operation.
Figure 4:
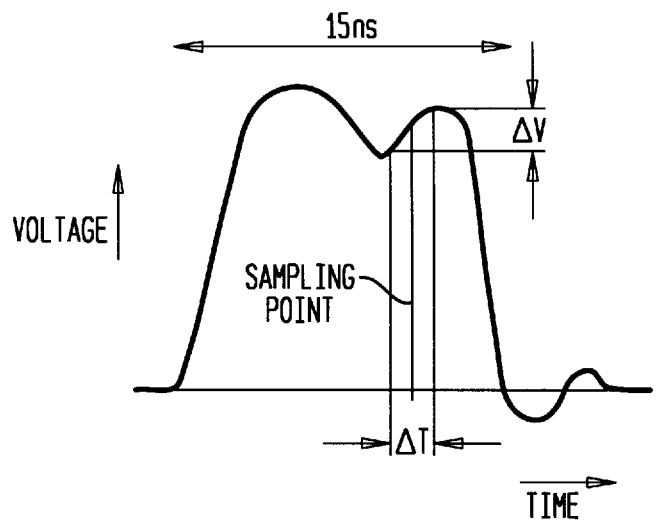
FIG. 4 is a graph showing a sampling point when A/D conversion is performed for an RGB video signal.
Figure 5:
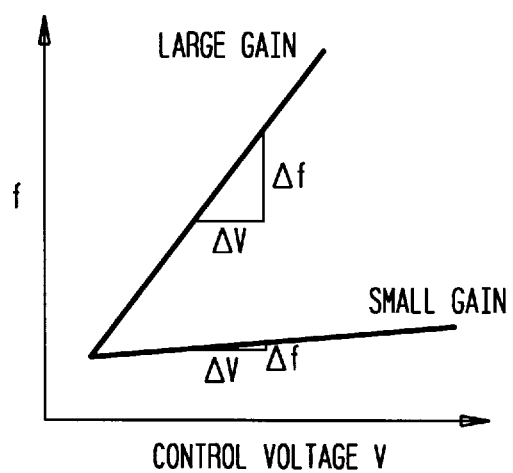
FIG. 5 is a graph showing the relationship between the gain of a VCO and its frequency variable range.

FIG. 3 is a plot of the voltage Vcf when the microcomputer 10 performs a shift operation. The "X"s in the graph indicate sampling points of the A/D converter 62 in the microcomputer 10. The threshold voltage values for Vcf are set to 1 V and 4 V, and when Vcf falls outside this range, the step of the D/A converter 62 is changed. It should be noted that, as illustrated, its when a plurality of values exceed the threshold that the shift operation starts. As a result, an erroneous operation due to noise superimposed on Vcf, or response to an overshoot is prevented.

Because the time constant for the LPF-c 68 of the sub-loop is large and the response is slow, it is expected that the acquisition time for the entire PLL circuit will be extended. As a countermeasure, an output step (step 5 in FIG. 2) for the D/A converter 66 locked with a specific resolution is stored in the EEPROM 12, and the next time, the one-chip microcomputer 10 employs that output step as a default value for a search.

The present invention is not limited to the above embodiment and various modifications can be employed. The arrangement of the PLL circuit in FIG. 1, according to the embodiment of the present invention, supports the resolutions for VGA and XGA. Since the capture range is continuous for the PLL circuit of the present invention, it can also handle intermediate resolution ranges such as SVGA.

Multiple sub-loops (i.e., coarse oscillation circuits that have various conversion gains) can be provided and controlled by the single microcomputer 10 in the same manner. The loop gain for the main loop and the capture ranges for the PLL circuit can be set on wide application.

In the circuit described above, since the loop gain at the time a lock is set is small, the noise in a LCD monitor will not have much affect on the PLL circuit, and a highly stable regenerated dot-clock can be provided. Further, since a wide frequency capture range is obtained by a single VCO, even though the loop gain at the time of a lock is set is small, multiscanning can be easily provided at a low cost.

While the invention has been described with respect to the illustrated embodiment, it will be understood by those skilled in the art that various changes can be made in that embodiment without departing from the spirit, scope and teaching of the invention.

What is claimed is:

1. A circuit for generating a dot-clock signal synchronized with a horizontal video synchronization signal for multiple display modes comprising:

voltage controlled oscillator that provides an output signal that varies in frequency with the magnitude of control voltages provided to inputs of the voltage controlled oscillator;

a variable frequency divider for dividing the output signal of said voltage controlled oscillator at a predetermined but changeable frequency division ratio which depends on the display mode;

a phase comparator comparing the phase of the output of said variable frequency divider with the phase of the horizontal video synchronization signal and providing an output indicative of the phase difference;

a fine control loop coupling the inputs of the voltage controlled oscillator to the output of the comparator to provide a first input control voltage to the voltage controlled oscillator, said fine control loop being a phase locked loop circuit with a low conversion gain to maintain a low noise ratio when a lock for the phase locked loop circuit is locked;

detection means for determining whether the lock on the phase locked loop circuit is released; and a coarse control loop including the detection means coupling the inputs of the oscillator to the output of the phase comparator for providing, only when the detection means indicates the lock is released, a change in a second input control voltage to the voltage controlled oscillator through a high conversion gain path with a wide variable frequency range.

2. The circuit according to claim 1, wherein said detection means periodically monitors the output level of the comparator for detecting whether said lock of the phase locked loop circuit has been released.

3. The circuit according to claim 2, wherein said voltage controlled oscillator is an LC oscillator.

4. The circuit according to claim 3 including a first voltage controlled capacitor in the fine control loop, said first voltage controlled capacitor having a narrow dynamic range that when exceeded releases the lock.

5. The circuit according to claim 4 including a second voltage controlled capacitor in the coarse control loop, said second controlled capacitor having a broad dynamic range.

6. The circuit according to claim 5 wherein said detection means includes a microprocessor which periodically checks for release of the lock providing a pulse output each time release of the lock is detected and means responsive to the pulse output providing a signal thru a low pass filter to the second voltage controlled capacitor to periodically change the frequency of the output signal provided by the oscillator unless the phase lock loop circuit is locked.

7. A circuit or generating a dot-clock signal synchronized with a horizontal synchronization signal of a video display comprising:

a voltage controlled oscillator that provides an output signal that varies in frequency with control voltages applied thereto, said voltage controlled oscillator having a first voltage controlled capacitor with a narrow dynamic range and a second voltage controlled capacitor with a broad dynamic range;

a variable frequency divider that divides the output signal of the voltage controlled oscillator at a changeable division ratio;

a phase comparator that compares the phase of the output of the variable frequency divider with the phase of the horizontal video signal providing an output indicative of the phase difference;

a phase locked loop circuit with a low conversion gain coupling the output of the phase comparator to the first voltage controlled capacitor to maintain a low noise ration when a lock for the phase locked loop circuit is locked;

a coarse control loop with a high conversion gain including a processor means that periodically checks for release of the lock for providing incremental changes in a voltage applied to the second voltage controlled capacitor to change the frequency of the oscillator output unless a check for the release of the lock indicates the lock is locked.

8. The circuit of claim 7 including a processor means that sets the division ratio of the variable frequency divider as a function of the display mode.

9. The circuit of claim 8 including an EEPROM storing predetermined frequency ratios to provide to the processor to establish the division ratio of the variable frequency divider suitable for the display resolution.

10. The circuit of claim 9 including a digital to analog converter for generating the incremental changes in voltage from digital signals provided by the processor.

11. The circuit of claim 10 wherein the EEPROM includes stored values used to advance the output of the digital to analog converter to a default value when there is a change in the display mode of operation.

12. The circuit of claim 11 including a low pass filter in the coarse control loop to filter the output of the digital to analog converter to minimize the effect of noise on the oscillator.

* * * * *